United States Patent
Mebarki et al.

(10) Patent No.: US 10,643,895 B2
(45) Date of Patent: May 5, 2020

(54) SELF-ALIGNED INTERCONNECTS FORMED USING SUBTRACTIVE TECHNIQUES

(71) Applicant: Applied Materials, Inc., Santa Clara, CA (US)

(72) Inventors: Bencherki Mebarki, Santa Clara, CA (US); Huixiong Dai, San Jose, CA (US); Yongmei Chen, San Jose, CA (US); He Ren, San Jose, CA (US); Mehul Naik, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/700,631

(22) Filed: Sep. 11, 2017

(65) Prior Publication Data

US 2017/0372960 A1 Dec. 28, 2017

Related U.S. Application Data

(62) Division of application No. 13/987,667, filed on Aug. 20, 2013, now Pat. No. 9,761,489.

(51) Int. Cl.
*H01L 21/768* (2006.01)
*H01L 21/3213* (2006.01)
*H01L 23/532* (2006.01)

(52) U.S. Cl.
CPC .. *H01L 21/76897* (2013.01); *H01L 21/32139* (2013.01); *H01L 21/76885* (2013.01); *H01L 23/53257* (2013.01); *H01L 23/53276* (2013.01); *H01L 2924/0002* (2013.01)

(58) Field of Classification Search
CPC ......... H01L 21/76897; H01L 21/76885; H01L 21/32139
See application file for complete search history.

(56) References Cited

U.S. PATENT DOCUMENTS

| | | | | |
|---|---|---|---|---|
| 5,525,542 A | * | 6/1996 | Maniar | H01L 21/0276 438/669 |
| 6,133,635 A | * | 10/2000 | Bothra | H01L 21/7682 257/748 |
| 6,423,644 B1 | | 7/2002 | NaHan et al. | |

(Continued)

FOREIGN PATENT DOCUMENTS

| | | |
|---|---|---|
| WO | 2008118941 | 10/2008 |
| WO | 2011130890 | 10/2011 |

(Continued)

OTHER PUBLICATIONS

K. Schuegraf et al., Semiconductor Logic Technology Innovation to Achieve Sub-10 nm Manufacturing, Mar. 2013, IEEE J. Electron Devices Soc., vol. 1, No. 3, pp. 66-75 (published Jun. 27, 2013) (Year: 2013).*

(Continued)

*Primary Examiner* — Victoria K. Hall
(74) *Attorney, Agent, or Firm* — Lowenstein Sandler LLP

(57) ABSTRACT

A method of forming an interconnect structure for semiconductor or MEMS structures at a 10 nm Node (16 nm HPCD) down to 5 nm Node (7 nm HPCD), or lower, where the conductive contacts of the interconnect structure are fabricated using solely subtractive techniques applied to conformal layers of conductive materials.

14 Claims, 12 Drawing Sheets

(56) References Cited

U.S. PATENT DOCUMENTS

| | | | |
|---|---|---|---|
| 7,008,869 B2* | 3/2006 | Han | H01L 21/32136 257/E21.311 |
| 7,303,988 B2* | 12/2007 | Shim | H01L 21/76852 257/758 |
| 8,232,210 B2 | 7/2012 | Cheng et al. | |
| 8,354,339 B2 | 1/2013 | Lin | |
| 8,367,544 B2 | 2/2013 | Cheng et al. | |
| 8,394,723 B2 | 3/2013 | Valdivia et al. | |
| 8,431,329 B2 | 4/2013 | Bae et al. | |
| 8,461,460 B2 | 6/2013 | Ryu et al. | |
| 2002/0155693 A1* | 10/2002 | Hong | H01L 21/76885 438/618 |
| 2003/0197279 A1* | 10/2003 | Lim | H01L 21/76897 257/774 |
| 2005/0009323 A1* | 1/2005 | Han | H01L 21/32136 438/636 |
| 2005/0009358 A1 | 1/2005 | Choi et al. | |
| 2005/0070080 A1 | 3/2005 | Lee et al. | |
| 2006/0121721 A1* | 6/2006 | Lee | H01L 21/76808 438/618 |
| 2006/0170058 A1* | 8/2006 | Chiang | H01L 21/0212 257/369 |
| 2007/0056925 A1 | 3/2007 | Liu et al. | |
| 2007/0075371 A1 | 4/2007 | Lim et al. | |
| 2007/0099417 A1 | 5/2007 | Fang | |
| 2007/0190718 A1* | 8/2007 | Coolbaugh | H01L 21/76808 438/253 |
| 2009/0001447 A1 | 1/2009 | Shimizu | |
| 2009/0090899 A1* | 4/2009 | Lim | H01L 27/2436 257/4 |
| 2009/0104782 A1 | 4/2009 | Lu et al. | |
| 2010/0252896 A1 | 10/2010 | Smayling et al. | |
| 2011/0108802 A1* | 5/2011 | Lin | B82Y 10/00 257/24 |
| 2011/0124134 A1* | 5/2011 | Lin | H01L 21/28008 438/14 |
| 2011/0151674 A1 | 6/2011 | Tang et al. | |
| 2011/0159691 A1 | 6/2011 | Shih et al. | |
| 2011/0177669 A1 | 7/2011 | Lee | |
| 2012/0280290 A1 | 11/2012 | Khakifrrooz et al. | |
| 2013/0001801 A1 | 1/2013 | Lin | |
| 2013/0059440 A1 | 3/2013 | Wang et al. | |
| 2013/0069238 A1* | 3/2013 | Usami | H01L 21/76897 257/769 |
| 2013/0098868 A1 | 4/2013 | Nishimura et al. | |
| 2013/0134598 A1 | 5/2013 | Anderson et al. | |
| 2013/0168867 A1* | 7/2013 | Shim | H01L 23/53223 257/773 |
| 2013/0244430 A1* | 9/2013 | Lin | H01L 29/49 438/692 |
| 2014/0054534 A1* | 2/2014 | Pellizzer | H01L 45/06 257/4 |
| 2014/0131883 A1 | 5/2014 | Huang | |

FOREIGN PATENT DOCUMENTS

| | | |
|---|---|---|
| WO | 2013032873 | 3/2013 |
| WO | 2015026390 A1 | 2/2015 |

OTHER PUBLICATIONS

J. Ward et al., Reduction of CNT Interconnect Resistance for the Replacement of Cu for Future Technology Nodes, Jan. 2012, IEEE Transactions on Nanotechnology, vol. 11, No. 1, pp. 56-62 (published May 5, 2012) (Year: 2012).*

B. Li et al., Controlled formation and resistivity scaling of nickel silicide nanolines, 2009, Nanotechnology, vol. 20, No. 085304, pp. 1-7 (published Feb. 2, 2009) (Year: 2009).*

J.W. McPherson, Reliability Challenges for 45nm and Beyond, 2006, 43rd ACM/IEEE Design Automation Conference, IEEE, p. 176-181 (published Jul. 2006) (Year: 2006).*

T. Nogami et al., CVD-Co/Cu(Mn) integration and reliability for 10 nm node, 2013 IEEE International Interconnect Technology Conference (published Jun. 2013) (Year: 2013).*

F. Liu et al., Subtractive W Contact and Local Interconnect Co-integration (CLIC), 2013 IEEE International Interconnect Technology Conference (published Jun. 2013) (Year: 2013).*

K. Coffey et al., Grain Boundary and Surface Scattering in Interconnect Metals, 2013 IEEE International Interconnect Technology Conference (published Jun. 2013) (Year: 2013).*

M. Katagiri et al., Electrical Properties of Multilayer Graphene Interconnects Prepared by Chemical Vapor Deposition, 2013 IEEE International Interconnect Technology Conference (published Jun. 2013) (Year: 2013).*

S. Chen et al., 48nm pitch Cu Dual-Damascene Interconnects using Self Aligned Double Patterning Scheme, 2013 IEEE International Interconnect Technology Conference (published Jun. 2013) (Year: 2013).*

"Resistivity Dominated by Surface Scattering in sub-50 run cu Wires", R.L. Graham, American Institute of Physics, (2010).

"Dry Etching Semiconductor Technology", Abhas Kumar, Preliminaries Dry Etching Advanced Topics, Department of Computer Science and Engineering Indian Institute of Technology, Kanpur, India, (2005).

"22 nm Half-Pitch Patterning by CVD Spacer Self Alignment Double Patterning (SADP)" Optical Microlithography XXI edited by Harry J. Levinson, Mircea V. Dusa, Proc. of SPIE vol. 6924, 69244E-I, (2008).

"Electrical Characterization of Copper Chemical Mechanical Polishing" T. Park et al., Microsystems Technology Laboratories, MIT, Sematech, Austin, Texas.

International Search Report and Written Opinion for PCT Patent Application No. PCT/2014/000177 dated Dec. 2, 2014, 6 pages.

* cited by examiner

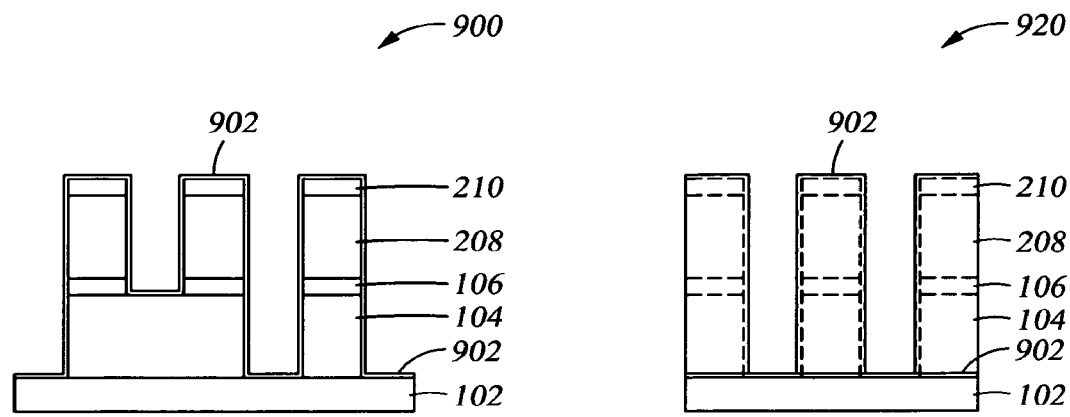
*Fig. 9A*          *Fig. 9B*
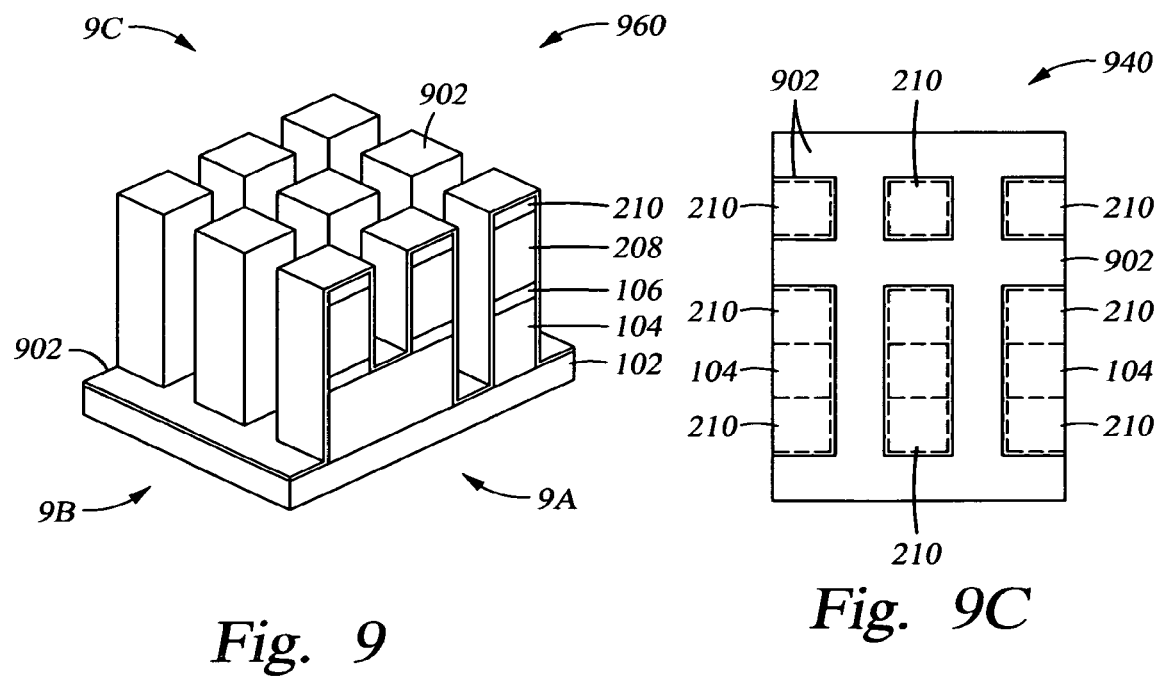
*Fig. 9*          *Fig. 9C*

SELF-ALIGNED INTERCONNECTS FORMED USING SUBTRACTIVE TECHNIQUES

CROSS-REFERENCE TO RELATED APPLICATION

This application is a continuation application of U.S. Non-Provisional patent application Ser. No. 13/987,667, filed Aug. 20, 2013, now U.S. Pat. No. 9,761,489, issued Sept. 12, 2017, which is hereby incorporated by reference herein in its entirety.

FIELD OF THE INVENTION

The present invention relates to a method of creating self-aligned permanent on-chip electrical interconnect structures.

BACKGROUND

This section describes background subject matter related to the disclosed embodiments of the present invention. There is no intention, either express or implied, that the background information discussed in this section legally constitutes prior art.

On-chip electrical interconnections have previously been produced using "dual-damascene" fabrication techniques in which apertures are created through various layers of the device structure, and the apertures are filled with a conductive material to form the interconnects between layers and between device features located on individual layers. However, for chips which are based on 10 nm Node and smaller feature sizes, there are gap fill and resistivity constraints which make it impractical to use the "dual-damascene" fabrication techniques which have previously been relied upon.

In the time frame of 1998, the semiconductor industry saw copper metallization emerging as the next generation interconnect technology, as the feature size decreased to the deep sub-micron regime. Unlike the metallization which traditionally was aluminum at that time, copper metallization required a damascene process because copper is difficult to etch. In the damascene process, ILD (interlayer dielectric) is first deposited and patterned to define "trenches" where the metal lines will lie. Then the metal is deposited to fill the patterned oxide trenches and polished to remove excess metal outside the desired lines using chemical-mechanical polishing (CMP). (Park, T. et al. "Electrical Characterization Of Copper Chemical Mechanical Polishing", Sematech, Austin, TX 1999). The article referenced describes early problems of copper dishing and oxide erosion during the polishing process. While solutions to various problems arising due to the use of CMP have been overcome during the past 14 years, the technology has progressed to a feature size of 10 nm Node or less with gap fill and resistivity increase problems which are expected to make the dual damascene process inadequate.

While the developers of the dual damascene process may have thought that feature sizes in the 10 nm range Nodes were unlikely in the near future due to patterning limitations, the development of half-pitch patterning by CVD spacer self alignment of the kind described by Christopher Bencher et al. in an article entitled: "22 nm Half-Pitch Patterning by CVD Spacer Self Alignment Double Patterning (SADP)", Optical Microlithography XXI, edited by Harry J. Levinson, Mircea V Dusa, Proc. of SPIE Vol. 6924, 69244E-1, (2008) showed that there were techniques which could expand semiconductor feature size reduction. The fabrication of 10 nm Node feature sizes is now within reach, and a new technique for the creation of surface-available conductive interconnects for semiconductor chips is needed.

There are a number of published U.S. patents and patent applications which show structures and describe fabrication techniques which may be used to create feature sizes in the range of 22 nm and lower. For example, U.S. Pat. No. 8,232,210 B2 to Cheng et al. titled "Double Patterning Process For Integrated Circuit Device Manufacturing", which issued on Jul. 31, 2012, from an application filed Sep. 18, 2009 describes a method of forming an integrated circuit (IC) device feature (and) includes forming an initially substantially planar hardmask layer over a semiconductor device layer to be patterned; forming a first photoresist layer over the hardmask layer; patterning a first set of semiconductor device features in the first photoresist layer; registering the first set of semiconductor device features in the hardmask layer in a manner that maintains the hardmask layer substantially planar; removing the first photoresist layer; forming a second photoresist layer over the substantially planar hardmask layer; patterning a second set of semiconductor device features in the second photoresist layer; registering the second set of semiconductor device features in the hardmask layer in a manner that maintains the hardmask layer substantially planar; removing the second photoresist layer; and creating topography within the hardmask layer by removing portions thereof corresponding to both the first and second sets of semiconductor device features. (Abstract).

Additional description related to methods for multiple patterning to reduce spacing between features is provided in U.S. Published Application No. 2011/0159691 of Shih et al., entitled: "Method For Fabricating Fine Patterns Of Semiconductor Device Utilizing Self-Aligned Double Patterning", which was published on Jun. 30, 2011. Further description related to multiple patterning to provide smaller feature sizes is provided in U.S. Pat. No. 8,431,320 B2 to Bae et al., entitled: "Self-Aligned Spacer Multiple Patterning Methods", issued Apr. 30, 2013. Additional description related to a method of adjusting the geometry of photomask patterns is provided in U.S. Pat. No. 8,394,723 B2 to Valdivia et al., entitled: "Aspect Ration Adjustment Of Mask Pattern Using Trimming To Alter Geometry Of Photoresist Features", issued Mar. 12, 2013. A "Double Patterning Process For Integrated Circuit Device Manufacturing" is described in U.S. Pat. No. 8,232,210 B2, issued Jul. 31, 2012.

There are a number of different techniques described for providing on-chip interconnect structures, such as in U. S. Patent Application Publication No. US 2013/0001801 A1 of Quinghuang Lin, titled: "Methods To Form Self-Aligned Permanent On-Chip Interconnect Structures", published Jan. 3, 2013. This reference describes interconnect structures where at least one patterned dielectric layer includes differently sized conductive features embedded therein, where the differently sized conductive features are laterally adjacent to each other and are located at the same interconnect level. (Abstract) At Page 2, in Paragraph [0017], the reference teaches that the methods of the invention utilize a single exposure, double patterning technique which includes forming dielectric sidewall structures on the sidewalls of the patterned photoresist, which produce a permanently patterned dielectric material upon subsequent curing. The sidewall structures are subsequently used to narrow the width of openings in the patterned photoresist, as described in Paragraph [0018].

U.S. Pat. No. 8,354,339 B2 to Qinghuang Lin, entitled: "Methods To Form Self-Aligned Permanent On-Chip Interconnect Structures", issued Jan. 15, 2012, describes the use of a dielectric sidewall structure over a patterned photoresist to narrow the width of openings present in the patterned photoresist. Subsequently, the patterned photoresist is removed, leaving a permanent patterned dielectric structure which is self-aligned and double patterned. An electrically conductive material is then formed within the narrowed width openings. (Abstract) U.S. Pat. No. 8,367,544 B2 to Cheung et al., entitled "Self-Aligned Patterned Etch Stop Layers For Semiconductor Devices", issued Feb. 5, 2013, describes a method of forming a semiconductor device which includes patterning a layer formed over a homogeneous semiconductor device layer to be etched; subjecting the semiconductor device to an implant process that selectively implants a sacrificial etch stop layer that is self-aligned in accordance with locations of features to be etched within the homogeneous semiconductor device layer, and at a desired depth for the features to be etched; etching a feature pattern defined by the patterned photoresist layer into the homogeneous semiconductor device layer, stopping on the implanted sacrificial etch stop layer; and removing remaining portions of the implanted sacrificial etch stop layer prior to filling the etched feature pattern with a fill material. (Abstract).

U.S. Patent Publication No. US 2012/0280290 A1, of Khakifirooz et al., entitled: "Local Interconnect Structure Self-Aligned To Gate Structure", published Nov. 8, 2012, describes the use of a common cut mask to define a gate pattern and a local interconnect pattern so that local interconnect structures and gate structures are formed with zero overlay variation relative to one another. In addition to the concern about alignment between gate structures and interconnect structures, there is a concern about electron scattering mechanisms in copper lines and the manner in which this behavior affects the extendibility of copper interconnects when line width or thickness is less than the mean free path. In an article entitled "Resistivity dominated by surface scattering in sub-50 nm cu wires" by R. L. Graham et al., published online 29 Jan. 2010 © 2010 American Institute of Physics [doi:10.1063/1.329022], the authors discuss electron scattering mechanisms in copper lines. Electron-beam lithography and a dual hard mask were used to produce interconnects with line widths between 25 and 45 nm. Electron backscatter diffraction was used to characterize grain structure. Temperature dependence of the line resistance determined resistivity which was consistent with existing models for completely diffused surface scattering and line-edge roughness, with little contribution from grain boundary scattering. As feature size shrinks, surface scattering and smaller grain size can lead to increased resistivity. The mean free path 'A, (MFP) of electrons in copper is said to be 39 nm, and this publication reports on copper lines of approximately this size. An analytical model was developed that describes resistivity from diffuse surface scattering and line-edge roughness. Examples of 22 nm half-pitch GDR structures were patterned into silicon. The authors concluded that with the physical limits of photolithography reached, and double patterning a certain path for device manufacturing in years to come, the spacer mask double patterning scheme clearly demonstrates the technical capabilities to meet roadmap requirements down to at least 22 nm half-pitch.

By using double patterning more than once it is possible to get pattern size down to about 10 nm half-pitch, for example. However, once the feature size is this small, it is very difficult to fill the wiring conduits with a metal. It is difficult to get a complete fill with metal through the space available for the metal to flow. In addition, it is very difficult to get alignment of connection surfaces when multiple layers are used to form metal lines and metal filled vias.

There remain a number of technical problems to be solved to enable the implementation of self-aligned interconnect structures at 22 nm half pitch and lower, and the present invention provides a fabrication technique for self-aligned interconnects which may be used for such implementation.

SUMMARY

The present method provides self-aligned interconnect structures for use in combination with semiconductor devices without the use of vias which are filled with contact material. Instead, all contact materials are deposited in conformal layers, so that no filling of any micro conduits with conductive material is required. Subsequently, a pattern is dry etched through a stack of layers which includes the layers of contact materials, so that pillars of contact material extend upward to provide interconnects extending from an underlying base layer which contains contacts which mate with surfaces on a semiconductor device. The pillars of contact material are typically metal, but may be doped ceramic compositions or conductive polymeric materials capable of transferring electrical current. It is also understood that the interconnect structures which are produced need not be in the form of vertical pillars, but may be in other shapes which may be processed from a stack of conformal layers using subtractive techniques.

The description below refers to the creation of metal pillars, because this is likely to be a frequently used form of the self-aligned interconnect structures; however, there is no intent to limit the embodiments to one form of a conductive path which comprises metals, doped ceramic compositions, or may be doped or un-doped conductive polymeric materials to provide the interconnect paths. It is intended that when a "metal" is referred to in the descriptions of the structures below, it is understood that other conductive materials which may be applied in the form of a conformal layer are also intended to be included.

CVD, PVD, ALD, and/or electroplated copper has been used as the interconnect material of choice in recent years. However, when the feature size is at the 10 nm Node (16 nm HPCD), due to the eMFP (electron mean free path) of copper (which is about 39 run), the effective resistivity is in the range of about 6 μohm-cm. When the feature size is at the 7 nm Node (11 nm HPCD), due to the eMFP of copper, the effective resistivity is in the range of about 6.5 μohm-cm; and, when the feature size is at the 5 nm Node (7 run HPCD), the effective resistivity of copper is in the range of about 11.5 μohm-cm. At the 7 run Node, and particularly at the 5 nm Node, a metal such as cobalt (with an eMFP of about 9.5 nm compared with 39 for copper), or tungsten (with an eMFP of about 19 nm), and silicide, by way of example, and not by way of limitation, become competitive with copper in terms of effective resistivity. For example, both copper and cobalt have an effective resistivity in the range of about 12 μohm-cm at the 5 nm Node, and tungsten has an effective resistivity of about 13.5.

The method of creating the interconnect structure embodiments includes the deposition of multiple layers of materials, followed by the use of subtractive techniques such as the dry etch techniques or Atomic Layer Etch (ALF). The conductive interconnects formed are surrounded by dielectric materials as necessary.

Examples of dry etch processes which have been used for etching of gate structures and which may be used for dry etching of interconnect structures, where some fine tuning may be required to achieve etching accuracy down to the 5 nm Node include the SiCoN dry etch process of Applied Materials, Inc., Santa Clara Calif., which is particularly useful for etching silicon or nitrogen containing materials such as silicon oxide or silicon nitride, or siliconoxynitride, for example and not by way of limitation. Dry etching of Pt—Mn layers is described in U.S. published application US 2013/0098868 A1, published Apr. 25, 2013. Dry etching of metal oxide and metal nitride layers, where the metal is a tungsten-containing layer, or a tantalum-containing layer, or a titanium-containing layer, is described in International (Patent) Publication No. WO 2008/118941 A2, published Oct. 2, 2008. Dry etching of gate structures of field effect transistors having a titanium nitride gate electrode, an "ultra-thin" (about 10 to 20 Angstroms) silicon dioxide and a polysilicon upper contact is described in U.S. (Patent) Publication No. U. S. 2005/0009358 1, published Jan. 13, 2005. A method of selectively dry etching a high k oxide layer with respect to a silicon based material is described in U.S. Publication No. U. S. 2007/0056925 A1, published Mar. 15, 2007. The high k layer is typically a metal oxide layer, and the silicon-based material is silicon or silicon nitride, for example. These examples of dry etching processes are provided to illustrate that the dry etch technology required to carry out the etching of the interconnect structures described in the present description is available in the art and need not be described herein. One of skill in the art can, with minimal searching, find other descriptions related to dry etching of metal layers, high K and low K dielectric layers, including ceramics and doped ceramics as well as the metal oxide layers mentioned above. While the etching processes may need to be fine tuned to enable fabrication of the structures described herein, one of skill in the art of semiconductor fabrication techniques should be able to carry out the dry etch steps described after minor experimentation.

By using a stack of varying layers which include line metal; etch stop material layers having a relatively high conductivity component (in the form of metal or doped ceramic or polymeric material); and, pattern transfer layers which make up a lithography stack (typically including a hard masking material); and by applying subtractive techniques to form desired structures within the stack, it is possible to form interconnect conduits in the form of pillars, for example, without the need to fill a tiny capillary with a fluid conductive material. The method of forming an interconnect structure which is described above makes it possible to progress to devices at the 16 nm Node and below.

Described herein is a method of forming an interconnect structure useful for semiconductor structures of MEMS devices at the N10 feature size or lower, wherein at least one subtractive process is used to fabricate the interconnect structure, so that electrical contacts, typically in the form of pillars, are self aligned relative to underlying line contacts. The contact pillars are solid, and without the presence of voids.

Figure 1A:
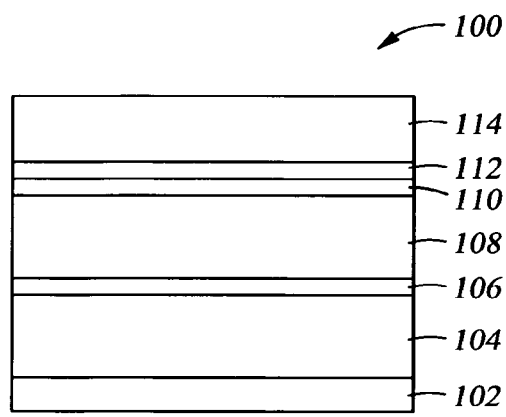
FIG. 1 shows a three dimensional view 160 of an exemplary starting "stack" of layers to be used to form an interconnect structure of the kind useful for the next generation of semiconductor devices and MEMS devices. The base layer 102 represents a structure which is contacted with an underlying semiconductor structure to connect the interconnect structure with an underlying semiconductor device. The base layer 102 comprises a metal layer, and typical material examples include a tungsten plug material or a copper layer. A line metal (conductive) layer 104 overlies base layer 102, and is typically a conformal layer of metal selected from metals such as tungsten, cobalt, a silicide, and combinations thereof. One skilled in the art may develop a specialized conductor material, depending on the particular application. The line metal layer may be deposited using a technique selected from CVD, PVD, ALD, deposition from an evaporated source of metal, and metal plating, by way of example and not by way of limitation.

An etch stop layer 106 which has low electrical resistivity overlies line metal layer 104. Etch stop layer 106 is typically a conformal layer of Ta, TaN, Ti, TiN, Co, Wi, Al, and combinations thereof, by way of example and not by way of limitation. Etch stop layer 106 may be deposited using a technique selected from CVD, PVD, ALD, deposition from an evaporated source of material, or by metal plating. Etch stop layer 106 may also be an oxide which is doped with a dopant selected from the group consisting of Ni, W, or B, by way of example and not by way of limitation. A pillar-forming metal (conductive) layer 108 overlies etch stop layer 106. The pillar-forming metal may be the same as the line-forming metals described above. Further, the etch selectivity of materials selected for line metal layer 104 and pillar-forming metal layer 108 need to be different from, but relatively close to, the etch selectivity of etch stop layer 106 and a second etch stop layer 110. The second etch stop layer 110 overlies the pillar-forming layer 108. The second etch stop layer composition is typically the same as the first etch stop layer for purposes of processing simplification.

A hard masking layer 112 overlies the second etch stop layer 110. Finally, a "lithography stack" which may be a single layer or a combination of layers, or a double patterning or pitch splitting defined structure, identified by the number 114 overlies hard masking layer 112. In this illustration, the lithography stack has been patterned through the upper surface 116 in an illustrative manner related to one embodiment of the invention.

Figure 1B:
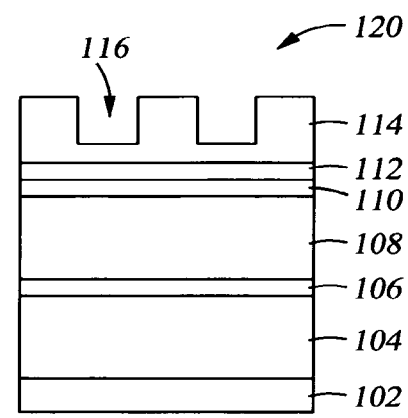
Figure 1:
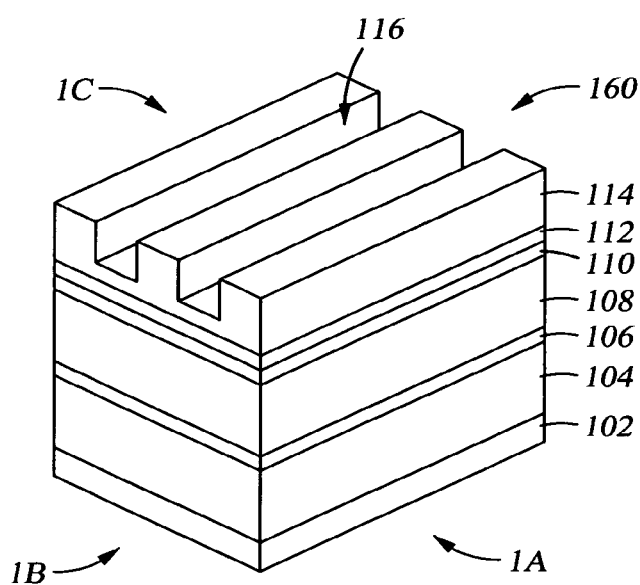

FIG. 1A shows a side view 100 of the three dimensional structure shown in FIG. 1.

FIG. 1B shows a front view 120 of the three dimensional structure shown in FIG. 1.

Figure 1C:
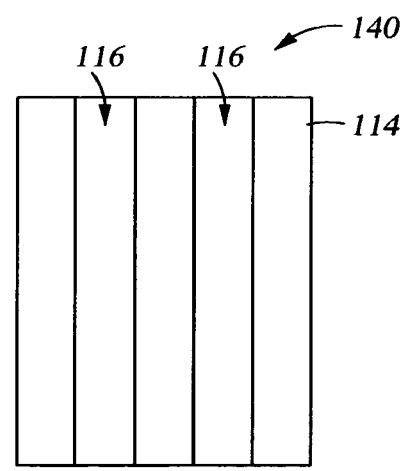

FIG. 1C shows a top view 140 of the three dimensional structure shown in FIG. 1.

Figure 2A:
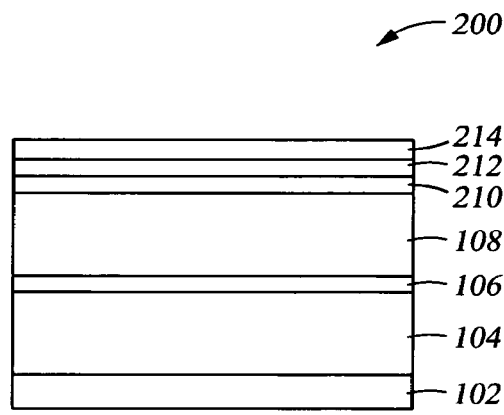
Figure 2B:
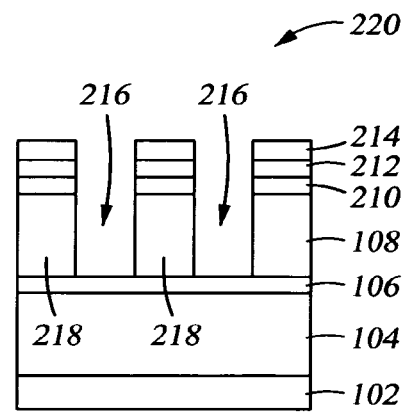
Figure 2:
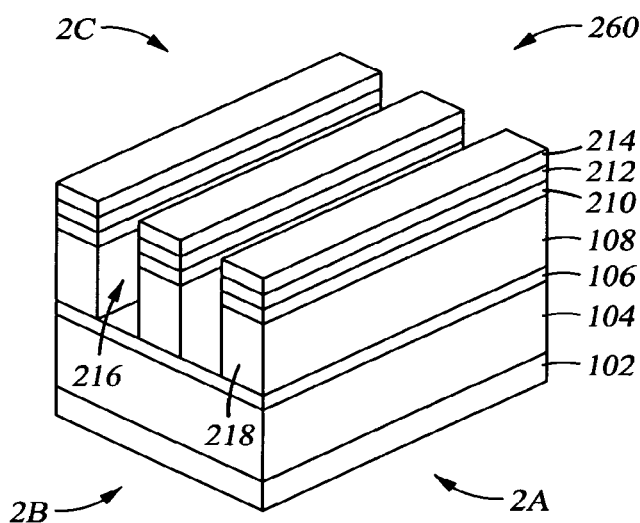

FIG. 2 shows a partially patterned structure 260 formed from the starting structure 160 illustrated in FIG. 1. The metal-conductive-line-forming layer 108 has been etched in a first direction down to the upper surface of first etch stop layer 106, to create upwardly extending precursor pillar-conductive lines 218 above first etch stop layer 106. Overlying the precursor pillar conductive lines 108 are lines 210 of the second etch stop layer, lines 212 of hard masking material, and lines 214 of remaining patterning material from the original "lithography stack" starting structure shown in FIG. 1.

FIG. 2A shows a side view 200 of the three dimensional structure shown in FIG. 2.

FIG. 2B shows a front view 220 of the three dimensional structure shown in FIG. 2, with spaces 216 (trenches) separating rows of material which will be further processed to become conductive interconnects.

Figure 2C:
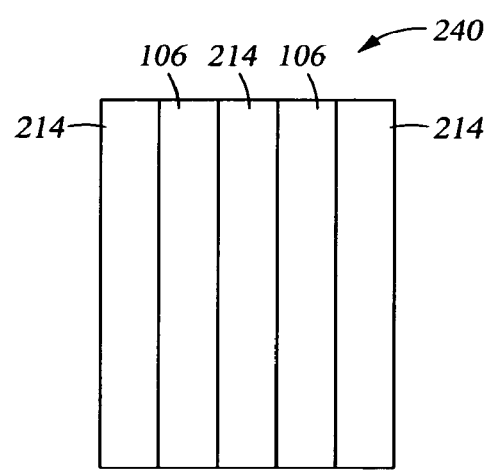

FIG. 2C shows a top view 240 of the three dimensional structure shown in FIG. 2.

Figures 3A, 3B:
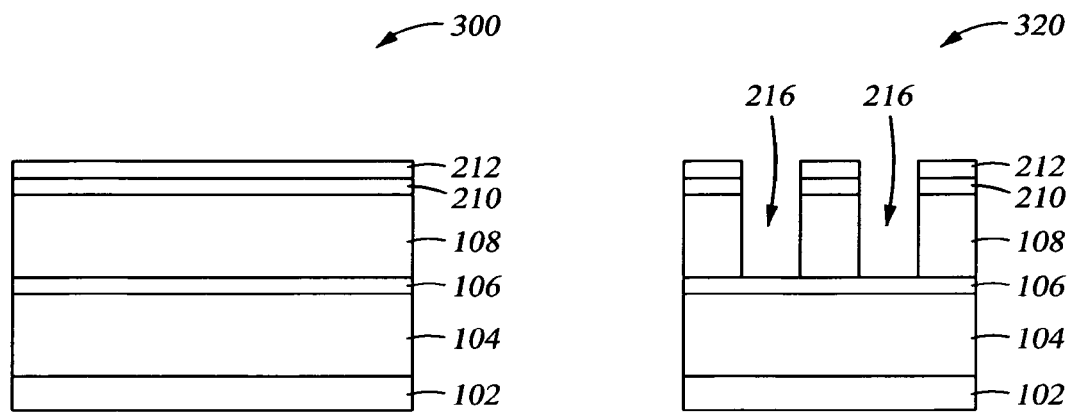
Figures 3, 3C:
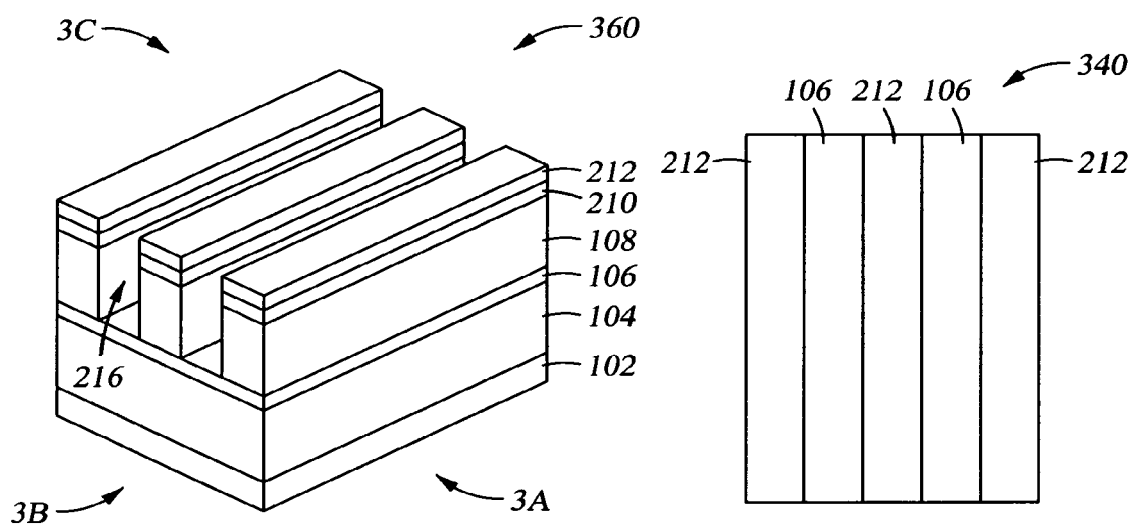

FIG. 3 shows a three dimensional view 360 of the partially patterned structure shown in FIG. 2 after the removal of residual patterning stack 214 material from the upper surface of said partially patterned structure.

FIG. 3A shows a side view 300 of the three dimensional structure shown in FIG. 3.

FIG. 3B shows a front view 320 of the three dimensional structure shown in FIG. 3, including trenches 216 separating rows of material which will be further processed to become conductive pillar interconnects.

FIG. 3C shows a top view 340 of the three dimensional structure shown in FIG. 3.

Figures 4A, 4B:
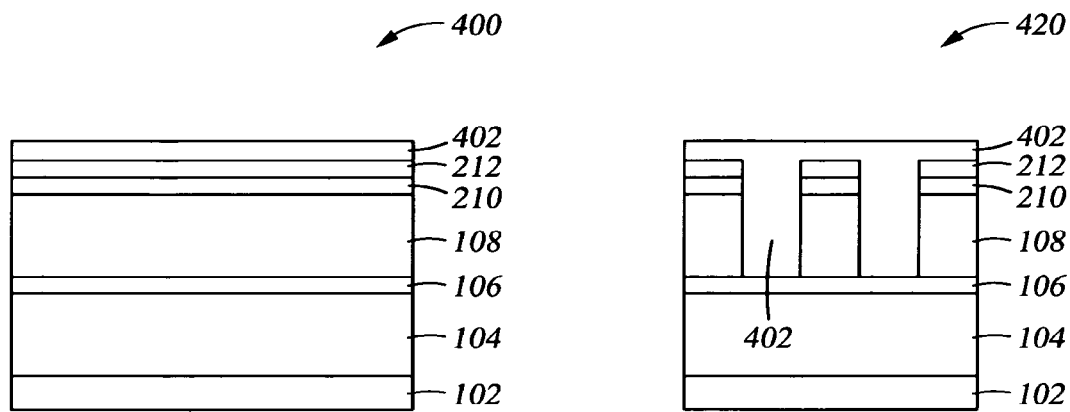
Figures 4, 4C:
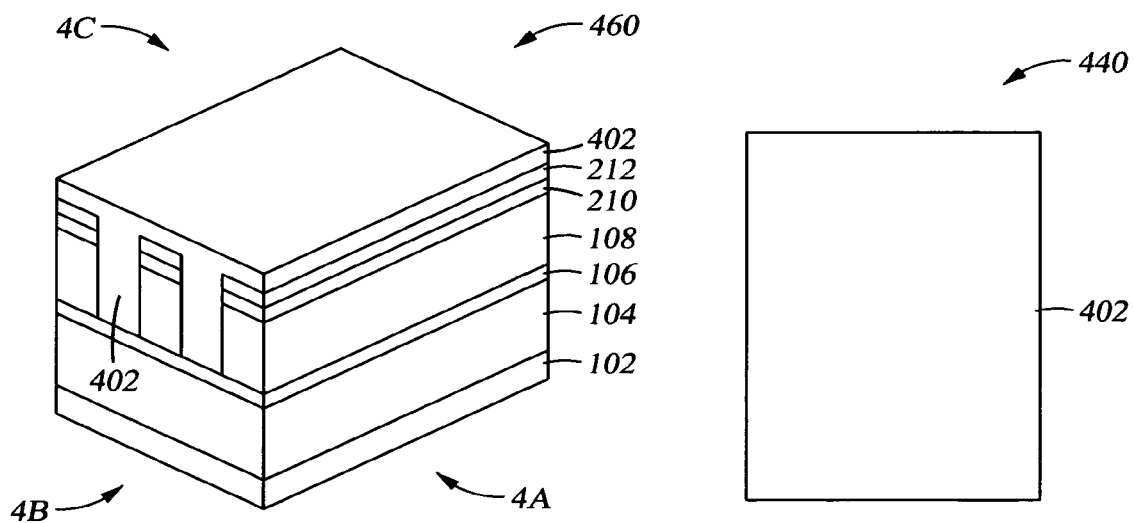

FIG. 4 shows a three dimensional view 460 of the partially patterned structure shown in FIG. 3 after filling of previously etched trenches 216 with a BARC or spin-on dielectric material 402, which is used to support a subsequently applied photoresist (not shown).

FIG. 4A shows a side view 400 of the three dimensional structure shown in FIG. 4.

FIG. 4B shows a front view 420 of the three dimensional structure shown in FIG. 4, including BARC or spin-on dielectric filled trenches separating rows of material which will be further processed to become conductive interconnects.

FIG. 4C shows a top view 440 of the three dimensional structure shown in FIG. 4.

Figure 5A:
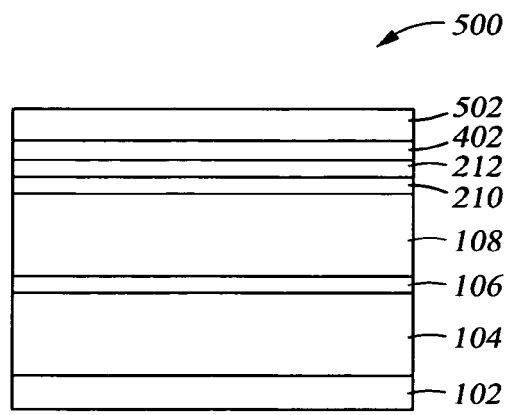
Figure 5B:
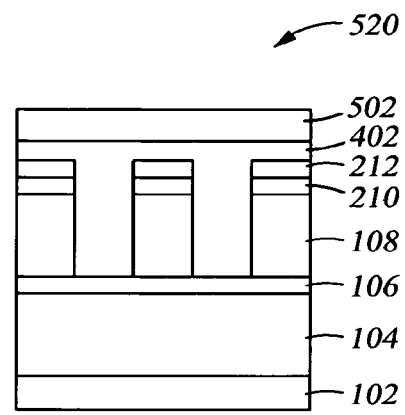
Figure 5:
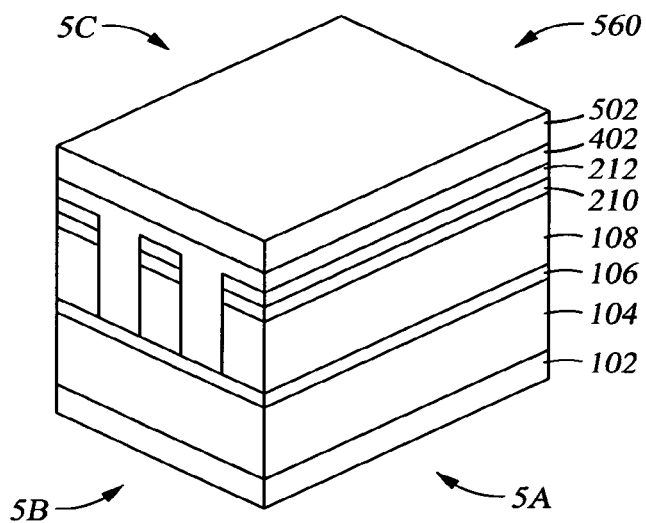

FIG. 5 shows a three dimensional view 560 of the partially patterned structure shown in FIG. 4 after application of a layer of photoresist 502 over the upper surface of the BARC or spin-on dielectric material 402.

FIG. 5A shows a side view 500 of the three dimensional structure shown in FIG. 5.

FIG. 5B shows a front view 520 of the three dimensional structure shown in FIG. 5, including BARC or spin-on dielectric filled trenches 402 separating rows of material which will be further processed to become conductive pillar interconnects.

Figure 5C:
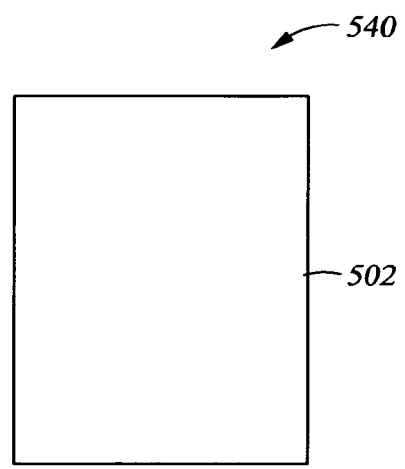

FIG. 5C shows a top view 540 of the three dimensional structure shown in FIG. 5.

Figure 6A:
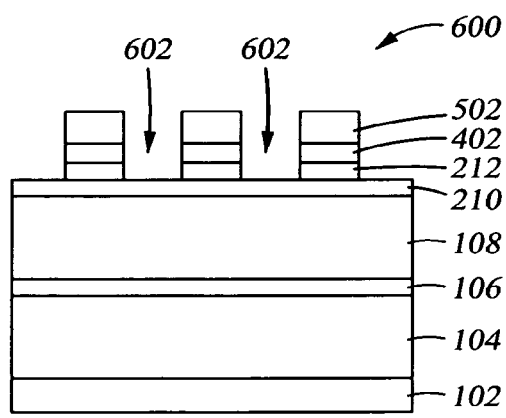
Figure 6B:
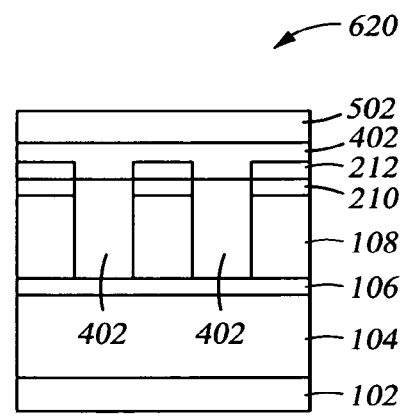
Figure 6:
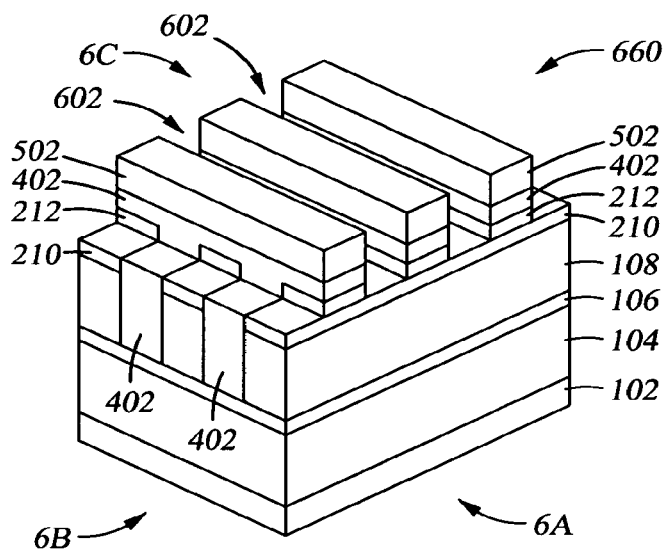

FIG. 6 shows a three dimensional view 660 of the partially patterned structure shown in FIG. 5 after etching of a series of spaces (trenches) 602 at a right angle to the previously etched trenches 216 (not shown, as they are filled with BARC or spin-on dielectric 402). The BARC or spin-on dielectric layer 402, and the hard masking layer 212 have been etched down to the upper surface of the second etch stop layer 210.

FIG. 6A shows a side view 600 of the three dimensional structure shown in FIG. 6.

FIG. 6B shows a front view 620 of the three dimensional structure shown in FIG. 6.

Figure 6C:
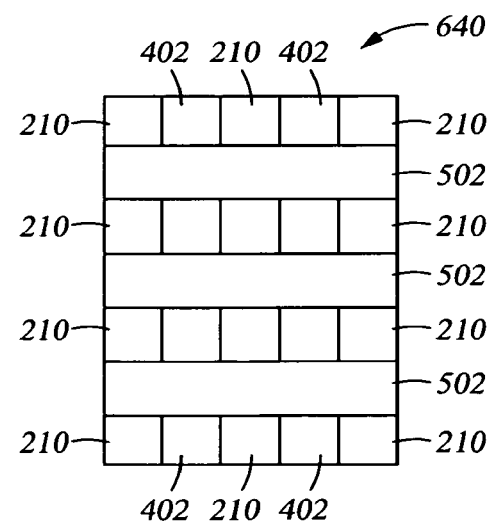

FIG. 6C shows a top view 640 of the three dimensional structure shown in FIG. 6.

Figures 7A, 7B:
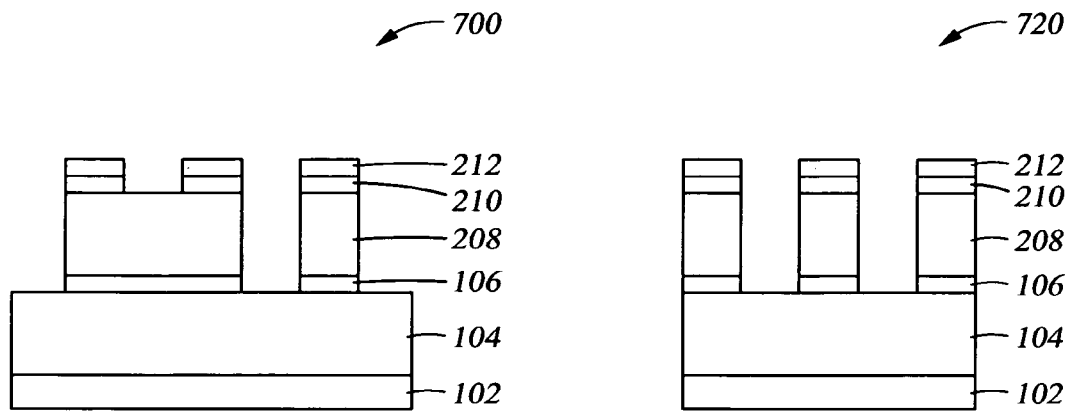
Figures 7, 7C:
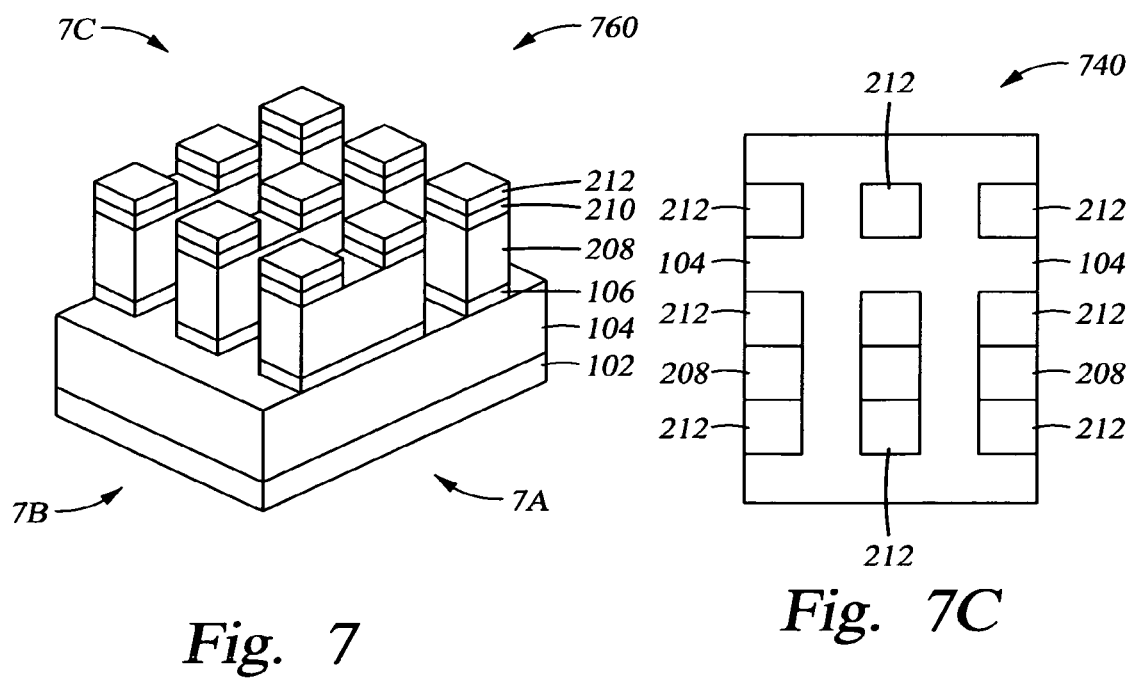

FIG. 7 shows a three dimensional view 760 of the partially patterned structure shown in FIG. 6, subsequent to dry etching down through layers 210, 208 and 106, to reach the upper surface of line metal layer 104, with patterning photoresist layer 502 and BARC or spin-on dielectric material 402 (shown in FIG. 6C) having been consumed during the etching process, or with any residues of these materials having been removed using processes known in the art.

FIG. 7A shows a side view 700 of the three dimensional structure shown in FIG. 7.

FIG. 7B shows a front view 720 of the three dimensional structure shown in FIG. 7.

FIG. 7C shows a top view 740 of the three dimensional structure shown in FIG. 7.

Figures 8A, 8B:
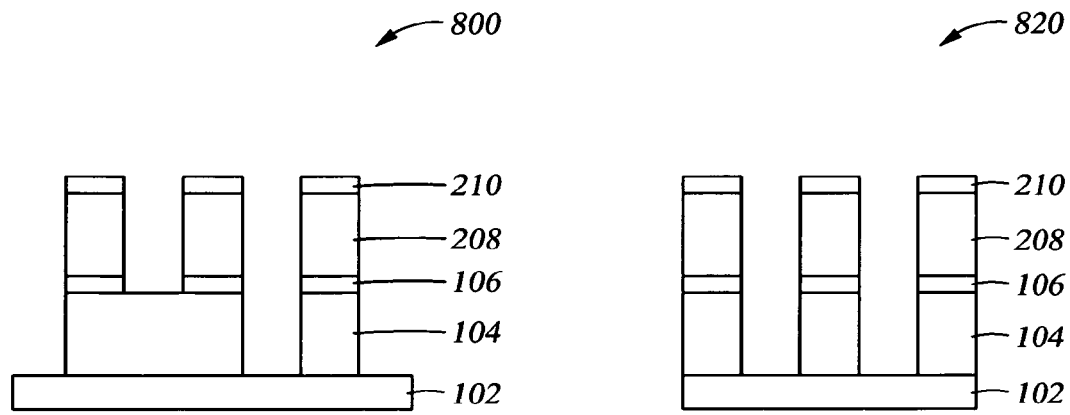
Figures 8, 8C:
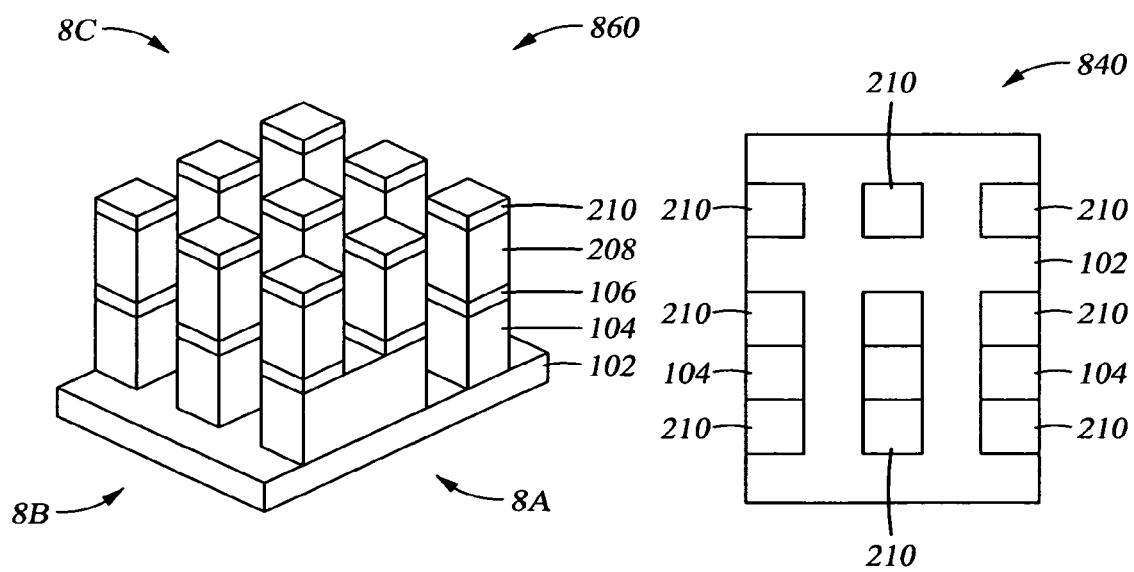

FIG. 8 shows a three dimensional view 860 of the partially patterned structure shown in FIG. 7, subsequent to the removal of the residue of hard masking layer 212.

FIG. 8A shows a side view 800 of the three dimensional structure shown in FIG. 8.

FIG. 8B shows a front view 820 of the three dimensional structure shown in FIG. 8.

FIG. 8C shows a top view 840 of the three dimensional structure shown in FIG. 8.

FIG. 9 shows a three dimensional view 960 of the patterned structure shown in FIG. 8, subsequent to application of an optional, as needed conformal passivation liner layer 902. The passivation liner layer 902 is preferably a dielectric layer. In some instances, the passivation liner layer 902 may be a low conductivity or high conductivity layer; when this layer is used an additional processing step for bottom etch is required. The passivation liner layer 902 may be a metal diffusion barrier, an oxygen diffusion barrier, or an adhesion layer, for example.

FIG. 9A shows a side view 900 of the three dimensional structure shown in FIG. 9.

FIG. 9B shows a front view 920 of the three dimensional structure shown in FIG. 9.

FIG. 9C shows a top view 940 of the three dimensional structure shown in FIG. 9.

Figures 10A, 10B:
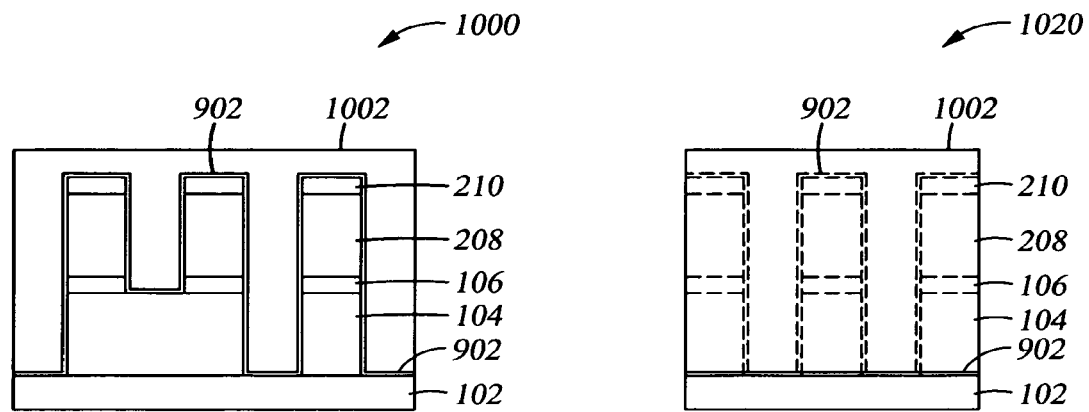
Figures 10, 10C:
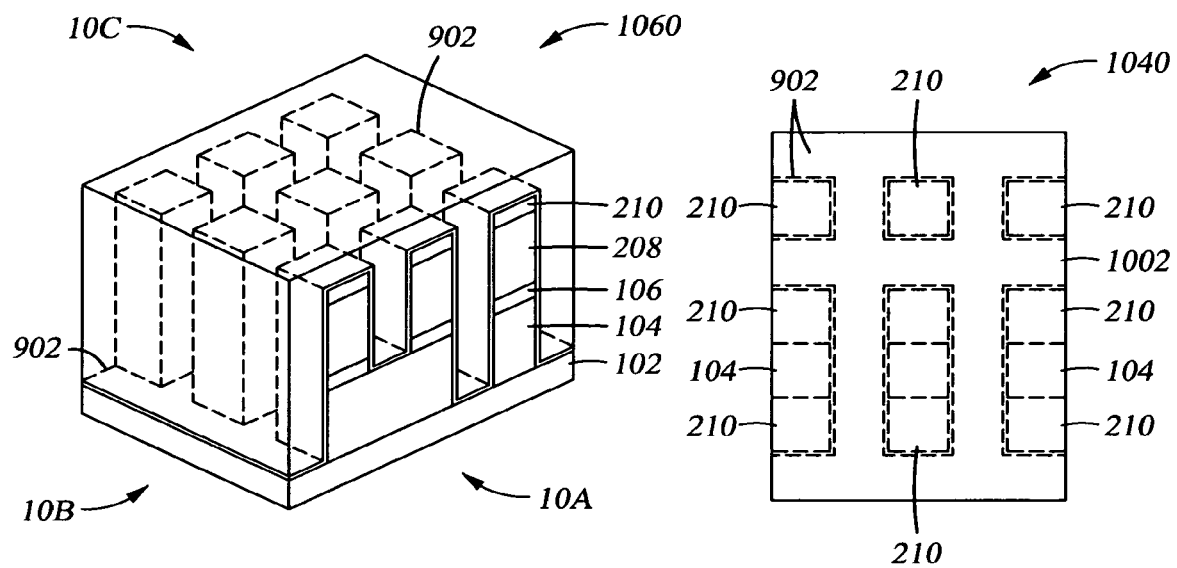

FIG. 10 shows a three dimensional view 1060 of the patterned structure shown in FIG. 9, subsequent to application of a low-k dielectric layer 1002 over the surface of the entire structure.

FIG. 10A shows a side view 1000 of the three dimensional structure shown in FIG. 10.

FIG. 10B shows a front view 1020 of the three dimensional structure shown in FIG. 10.

FIG. 10C shows a top view 1040 of the three dimensional structure shown in FIG. 10.

Figure 11A:
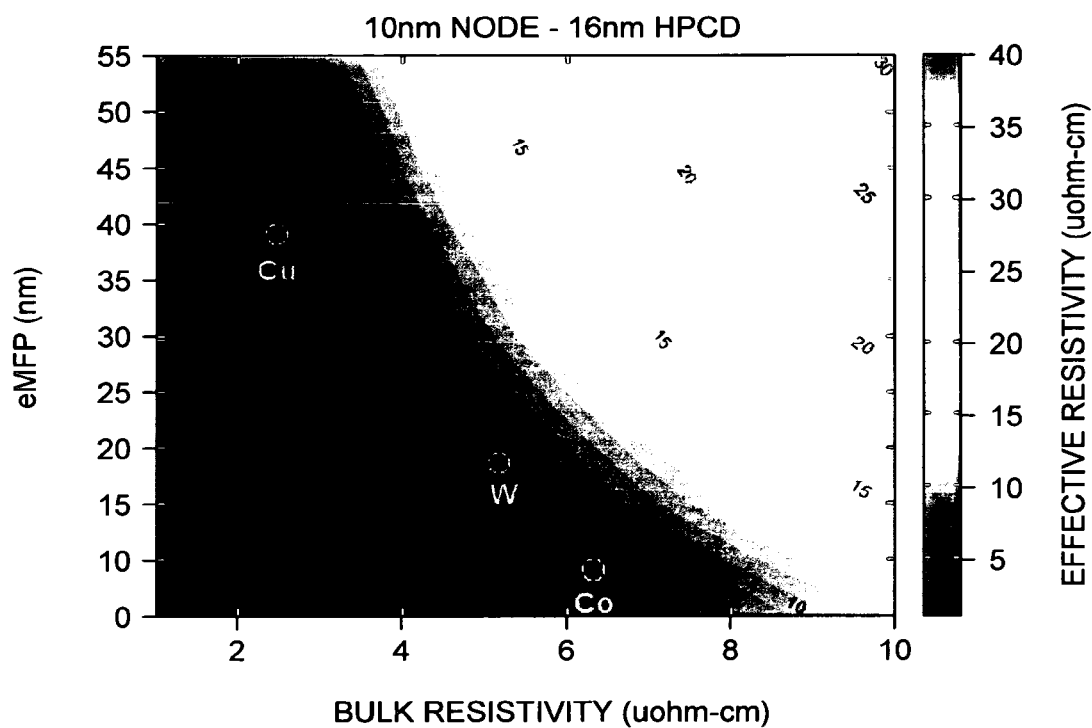

FIG. 11A shows an illustration of eMFP (Electron Mean Free Path) relative to bulk resistivity, and relative to effective resistivity for Cu, W, and Co when the semiconductor structure dimensions are at a 10 nm Node (16 nm HPCD).

Figure 11B:
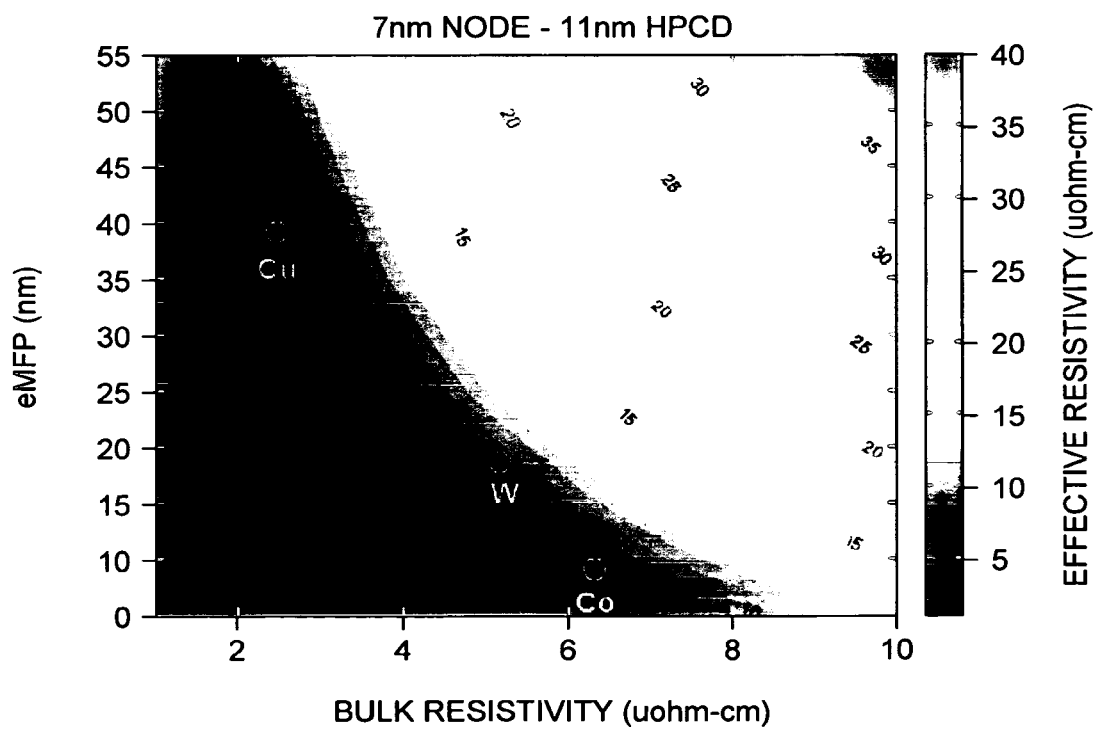

FIG. 11B shows an illustration of eMFP (Electron Mean Free Path) relative to bulk resistivity, and relative to effective resistivity for Cu, W, and Co when the semiconductor structure dimensions are at a 7 nm Node (11 nm HPCD).

Figure 11C:
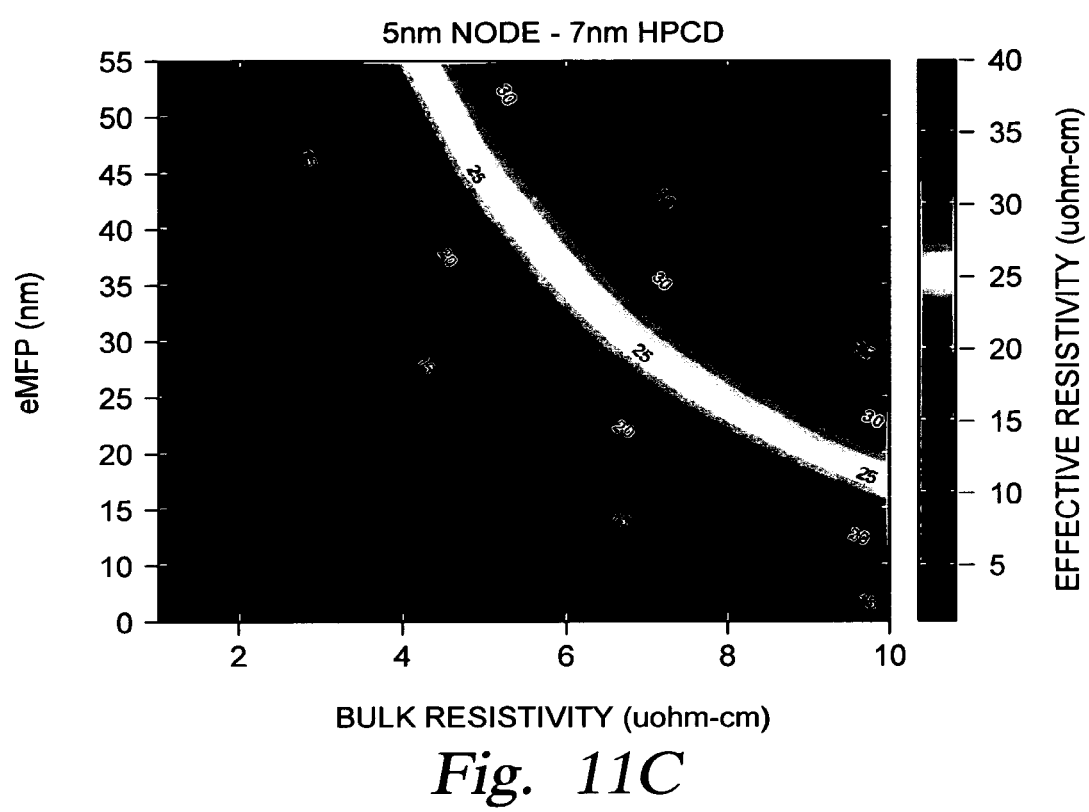

FIG. 11C shows an illustration of eMFP (Electron Mean Free Path) relative to bulk resistivity, and relative to effective resistivity for Cu, W, and Co when the semiconductor structure dimensions are at a 5 nm Node (7 nm HPCD).

DETAILED DESCRIPTION OF EXEMPLARY EMBODIMENTS

As a preface to the detailed description, it should be noted that, as used in this specification and the appended claims, the singular forms "a", "an", and "the" include plural referents, unless the context clearly dictates otherwise.

When the word "about" is used herein, this is intended to mean that the nominal value presented is precise within ±10%.

The description below refers to the creation of metal pillars, because this is likely to be a preferred form of the self-aligned interconnect contact structures; however, there is no intent to limit the embodiments to one form of a conductive path which comprises metals, doped ceramic compositions, or conductive polymeric materials to provide the interconnect paths. It is intended that when a "metal" is referred to in the descriptions of the structures below, it is understood that other conductive materials which may be processed from a stack of conformal layers to produce interconnects are also intended to be included.

As discussed above, as the feature size for semiconductor devices has decreased, and particularly at the 10 nm Node (16 nm HPCD) or lower, it becomes very difficult to fill trenches and vias which provide interconnects between various functioning features of a device. In addition, while CVD, PVD, ALD, and/or electroplated copper has been used as the interconnect material of choice in recent years, when the feature size is at the 10 nm Node or lower, the effective resistivity of copper increases relative to other conductive materials which have a lower eMFP.

The present invention provides a method of fabricating electrical interconnects for semiconductor device structures by combining a variety of known processing steps with particular combinations of materials in a new manner, to provide improved, surprisingly robust interconnect structures.

The method of creating embodiments of the interconnects features makes use of multiple conformal layers of materials, followed by the use of subtractive techniques such as dry etch techniques, and Atomic Layer Etch (ALE). Examples of dry etch technology which may be used as a subtractive technique to form the structural embodiments of the present invention interconnect structures are described in the "Background Art" section provided above. Other dry etch methods known in the art may be used as well.

By using a stack of varying layers which include a metal or other conductive material having a low electrical resistivity (μohm-cm) and which can function as a conductive line or a pillar conductive contact; an etch stop material having a relatively high conductivity (in the form of metal, or doped ceramic, or polymeric material); and, pattern transfer layers which make up a lithography stack (typically including a hard masking material); and by applying subtractive techniques to form desired structures within the stack, it is possible to form interconnect contacts in the form of pillars, for example, without the need to fill a tiny capillary with a fluid conductive material. This method of forming an interconnect structure makes it possible to progress to devices at the 16 nm Node and below.

Example Embodiments

The Example Embodiments are described below with respect to the representative drawings submitted as a part of this application.

FIG. 1 shows a three dimensional view 160 of an exemplary starting "stack" of layers to be used to form an interconnect structure of the kind useful for the next generation of semiconductor devices. The base layer 102 represents a structure which is contacted with an underlying semiconductor structure to connect the interconnect structure with an underlying semiconductor device. The base layer 102 may be a tungsten plug if connected to a FEOL (front end of line) device such as a transistor, capacitor, or resistor, for example; or, the base layer 102 may be copper or other conductive plug material if an interconnect is required.

The line metal (conductive) layer 104 overlies base layer 102, and is typically a conformal layer of material selected from metals such as tungsten, cobalt, ruthenium, silicide, graphene, or combinations thereof, for example and not by way of limitation. The line metal or other conductive layer may be deposited using a technique selected from CVD, PVD, ALD, deposition from an evaporated source of metal, or metal plating, by way of example and not by way of limitation.

An etch stop layer 106 which has low electrical resistivity overlies line metal conductive layer 104. Etch stop layer 106 is typically a conformal layer of Ta, TaN, Ti, TiN, W, Co, Ru, and combinations thereof, which are deposited using a technique selected from CVD, PVD, ALD, deposition from an evaporated source of metal, metal plating, or may be an oxide of Ti, which is doped with a dopant such as a silicide.

A pillar-forming conductive layer 108 overlies etch stop layer 106. The pillar-forming metal may (but need not be) the same as the line-forming metals described above. Typically the pillar forming material may be selected from W, Co, Ru, silicide, graphene, or combinations thereof, for example and not by way of limitation.

A second etch stop layer 110 overlies a conductive pillar-forming layer 108. The second etch stop layer composition may be (but need not be) the same as the first etch stop layer for purposes of processing simplification.

A hard masking layer 112 overlies the second etch stop layer 110. The hard masking layer is used in combination with an overlying "lithography stack" 114 to transfer a device pattern through underlying layers 110, 108, 106, and 104 which are described above. The lithography stack 114 may be a single layer or a combination of layers. The lithography stack 114 is not described herein, but may be fabricated using materials and patterning techniques which are known in the art as being capable of providing a pattern at a 10 nm Node (16 nm HPCD) or lower. In the illustration shown in FIG. 1, the pattern is shown in the form of trenches 116 present within lithography stack 114. However, the pattern may also be in the form of a split (layout of complementary patterns) or a contact print pattern.

FIG. 1A shows a side view 100 of the three dimensional structure shown in FIG. 1. FIG. 1B shows a front view 120 of the three dimensional structure shown in FIG. 1. FIG. 1C shows a top view 140 of the three dimensional structure shown in FIG. 1.

FIG. 2 shows a partially patterned structure 260 formed from the starting structure 160 illustrated in FIG. 1. The conductive pillar-forming layer 108 has been etched in a first direction down to the upper surface of first etch stop layer 106, to create upwardly extending conductive lines 218 above first etch stop layer 106. Overlying the lines formed from conductive pillar-forming layer 108 are lines 210 of the second etch stop layer, lines 212 of hard masking material, and lines 214 of residual patterning material from the original "lithography stack" starting structure shown in FIG. 1. Typically the conductive lines are formed from a metal, and that metal is one which provides the effective resistivity dictated by the Node size of the semiconductor structure.

FIG. 2A shows a side view 200 of the three dimensional structure shown in FIG. 2. FIG. 2B shows a front view 220 of the three dimensional structure shown in FIG. 2, with spaces 216 (trenches) separating rows of pillar-forming material 108 which will be further processed to become conductive interconnect contacts. FIG. 2C shows a top view 240 of the three dimensional structure shown in FIG. 2.

FIG. 3 shows a three dimensional view 360 of the partially patterned structure shown in FIG. 2 after the removal of residual patterning stack 214 material from the upper surface of said partially patterned structure. FIG. 3A shows a side view 300 of the three dimensional structure shown in FIG. 3. FIG. 3B shows a front view 320 of the three dimensional structure shown in FIG. 3, including trenches 216 separating rows of material which will be further processed to become conductive interconnects. FIG. 3C shows a top view 340 of the three dimensional structure shown in FIG. 3.

FIG. 4 shows a three dimensional view 460 of the partially patterned structure shown in FIG. 3 after filling of previously etched trenches 216 with a BARC or spin-on dielectric material 402, which is used to support a subsequently applied photoresist. The BARC (Bottom Anti-reflective Coating) typically is formed from at least one polymer component, a crosslinking component, and an acid generator. The BARC is cured after application to the substrate surfaces, so that the precursor materials are able to penetrate into spaces having a minimal critical dimension. FIG. 4A shows a side view 400 of the three dimensional structure shown in FIG. 4. FIG. 4B shows a front view 420 of the three dimensional structure shown in FIG. 4, including BARC or spin-on dielectric filled trenches separating rows of material which will be further processed to become conductive interconnects. FIG. 4C shows a top view 440 of the three dimensional structure shown in FIG. 4.

FIG. 5 shows a three dimensional view 560 of the partially patterned structure shown in FIG. 4 after application of a layer of photoresist 502 over the upper surface of the BARC or spin-on dielectric material 402. FIG. 5A shows a side view 500 of the three dimensional structure shown in FIG. 5. FIG. 5B shows a front view 520 of the three dimensional structure shown in FIG. 5, including BARC or spin-on dielectric filled trenches 402 separating rows of material 108 which will be further processed to become conductive interconnect contacts. FIG. 5C shows a top view 540 of the three dimensional structure shown in FIG. 5.

FIG. 6 shows a three dimensional view 660 of the partially patterned structure shown in FIG. 5 after etching of a series of spaces (trenches) 602 at a right angle to the previously etched trenches 216 (not shown, as they are filled with BARC or spin-on dielectric 402). The BARC or spin-on dielectric layer 402, and the hard masking layer 212 have been etched down to the upper surface of the second etch stop layer 210. FIG. 6A shows a side view 600 of the three dimensional structure shown in FIG. 6. FIG. 6B shows a front view 620 of the three dimensional structure shown in FIG. 6. FIG. 6C shows a top view 640 of the three dimensional structure shown in FIG. 6.

FIG. 7 shows a three dimensional view 760 of the partially patterned structure shown in FIG. 6, subsequent to dry etching down through layers 210, 208 and 106, to reach the upper surface of line metal layer 104, with patterning photoresist layer 502 and BARC or spin-on dielectric material 402 having been consumed during the etching process, or with any residues of these materials having been removed using well known dry etching processes or Atomic Layer Etch (ALE) if necessary. FIG. 7A shows a side view 700 of the three dimensional structure shown in FIG. 7. FIG. 7B shows a front view 720 of the three dimensional structure shown in FIG. 7. FIG. 7C shows a top view 740 of the three dimensional structure shown in FIG. 7.

FIG. 8 shows a three dimensional view 860 of the partially patterned structure derived from the structure shown in FIG. 7, subsequent to selective removals of layers 108 (shown as layer 208 in the Figures subsequent to FIG. 6C), 106 and 104 while the patterned hard masking layer 212 is still there, followed by the removal of hard masking layer 212, typically by a dry etching process using an etchant plasma which does not affect layers 210, 208, 106, 104, and 102, but just removes the hard masking layer 212. FIG. 8A shows a side view 800 of the three dimensional structure shown in FIG. 8. FIG. 8B shows a front view 820 of the three dimensional structure shown in FIG. 8. FIG. 8C shows a top view 840 of the three dimensional structure shown in FIG. 8.

The contact pillars formed are self-aligned with the underlying metal lines, and this solves potential overlay issues at the 10 nm Node and below. Both the trench metal and the pillars metal are etched at the same time. The metal line material and the metal pillar material are selected to have the same etch selectivity relative to the high conductivity etch stop layers 106 and 210. The low resistivity etch stop layer 210 may be used as a hard mask within the processing method. The low resistivity etch stop layer 106 acts as a low resistance contact material between the lines and pillars.

FIG. 9 shows a three dimensional view 960 of the patterned structure shown in FIG. 8, subsequent to application of an optional, as needed, conformal liner 902. A dielectric liner is typically used. A conductive liner may be used, but this would require additional steps such as a directional etch to clean "bottoms". The function of the conformal liner is typically as a diffusion barrier to metal or to oxygen, or as an adhesion layer. FIG. 9A shows a side view 900 of the three dimensional structure shown in FIG. 9. FIG. 9B shows a front view 920 of the three dimensional structure shown in FIG. 9. FIG. 9C shows a top view 940 of the three dimensional structure shown in FIG. 9.

FIG. 10 shows a three dimensional view 1060 of the patterned structure shown in FIG. 9, subsequent to application of a low-k dielectric layer 1002 over the surface of the entire structure. The low-k dielectric layer 1002 may be a doped polymeric material which is polymerized after deposition so that the precursor easily deposits into the trench spaces between pillars. For structures below N 10- N 5 nodes, the "k" value will be below 2.2, or an "Air Gap" technique/process may be used. FIG. 10A shows a side view 1000 of the three dimensional structure shown in FIG. 10. FIG. 10B shows a front view 1020 of the three dimensional structure shown in FIG. 10. FIG. 10C shows a top view 1040 of the three dimensional structure shown in FIG. 10.

FIG. 11A shows an illustration of eMFP (Electron Mean Free Path) relative to bulk resistivity, and relative to effective resistivity for Cu, W, and Co when the semiconductor structure dimensions are at a 10 nm Node (16 nm HPCD). FIG. 11B shows an illustration of eMFP (Electron Mean Free Path) relative to bulk resistivity, and relative to effective resistivity for Cu, W, and Co when the semiconductor structure dimensions are at a 7 nm Node (11 nm HPCD). FIG. 11C shows an illustration of eMFP (Electron Mean Free Path) relative to bulk resistivity, and relative to effective resistivity for Cu, W, and Co when the semiconductor structure dimensions are at a 5 nm Node (7 nm HPCD). It becomes apparent in viewing FIGS. 11A through 11C that at the 5 nm Node, the effective resistivity of copper and cobalt becomes essentially the same, and that tungsten becomes competitive as a metal pillar as well.

The above described exemplary embodiments are not intended to limit the scope of the present invention, as one skilled in the art can, in view of the present disclosure, expand such embodiments to correspond with the subject matter of the invention claimed below.

We claim:

1. An intermediate structure used for forming an interconnect structure, the intermediate structure formed by a process comprising:
   providing a horizontal electrically conductive base layer;
   providing a line metal conductive layer overlaying the horizontal electrically conductive base layer;
   providing a first etch stop layer overlaying the line metal conductive layer;
   providing a pillar-forming conductive layer overlaying the first etch stop layer;
   providing a second etch stop layer directly overlaying the pillar-forming conductive layer;

providing a hard masking layer overlaying the second etch stop layer;

providing a lithography stack overlaying the second etch stop layer;

patterning the lithography stack in a first direction to enable partial formation of conductive contact pillars from the pillar-forming conductive layer;

selectively etching the hard masking layer, the second etch stop layer and the pillar forming conductive layer down to the first etch stop layer, using the patterned lithography stack, wherein the first etch stop layer bounds a first etch process that partially forms the conductive contact pillars;

overfilling trenches between the partially formed conductive contact pillars with a spin-on dielectric material, forming a planar upper layer of the spin-on dielectric material above the partially formed contact pillars;

lithographically patterning a resist layer on top of the planar upper layer of the spin-on dielectric material in a second direction perpendicular to the first direction to enable subsequent formation of conductive lines from the line metal conductive layer; and selectively etching the hard masking layer down to the second etch stop layer, using the patterned resist layer, wherein the second etch stop layer bounds a second etch process that creates a patterned hard mask.

2. The intermediate structure of claim 1, wherein one or more of the line metal conductive layer or the pillar-forming conductive layer is formed from a material selected from the group consisting of copper, tungsten, cobalt, silicide, graphene, and combinations thereof.

3. The intermediate structure of claim 1, wherein one or more of the line metal conductive layer or the pillar-forming conductive layer is formed from a doped structure comprising a silicide, graphene, or combinations thereof.

4. The intermediate structure of claim 1, wherein the conductive contact pillars and the conductive lines are both formed from a material having an effective resistivity and electron mean free path suitable for a 10 nm Node and below.

5. The intermediate structure of claim 1, wherein the conductive contact pillars and the conductive lines are both formed from a material having an effective resistivity and electron mean free path suitable for a 10 nm Node down to a 5 nm Node.

6. The intermediate structure of claim 5, wherein the effective resistivity is within the range of about 1.7 μohm-cm to about 20 μohm-cm.

7. The intermediate structure of claim 5, wherein the electron mean free path is within the range of about 7 nm to about 20 nm.

8. The intermediate structure of claim 1, wherein the conductive contact pillars are self-aligned relative to the conductive lines.

9. The intermediate structure of claim 1, wherein the intermediate structure, when processed to form the interconnect structure, is adapted to interface with an upper surface of a semiconductor device or a MEMS structural device.

10. The intermediate structure of claim 9 wherein the semiconductor device or the MEMS structural device is compatible with a 10 nm Node down to a 5 nm Node or lower.

11. The intermediate structure of claim 1, wherein the lithography stack is patterned in a form of etched trenches, pitch splitting, or contact printing.

12. An interconnect structure formed by performing a subtractive etching process on the intermediate structure of claim 1, wherein the interconnect structure comprises conductive lines along the second direction and conductive contact pillars protruding from the conductive lines.

13. The interconnect structure of claim 12, wherein the conductive contact pillars are solid and free of voids as a result of the subtractive etching process.

14. The interconnect structure of claim 12, wherein the subtractive etching process comprises:

selectively removing, using the patterned hard mask, from the intermediate structure, portions of the pillar-forming conductive layer and portions of the line metal conductive layer, to form the interconnect structure.

* * * * *